US009813023B2

(12) United States Patent
Caffee

(10) Patent No.: US 9,813,023 B2
(45) Date of Patent: Nov. 7, 2017

(54) COMMON-MODE IMPEDANCE NETWORK FOR REDUCING SENSITIVITY IN OSCILLATORS

(71) Applicant: Silicon Laboratories Inc., Austin, TX (US)

(72) Inventor: Aaron J. Caffee, Scappoose, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/970,865

(22) Filed: Dec. 16, 2015

(65) Prior Publication Data
US 2017/0179881 A1 Jun. 22, 2017

(51) Int. Cl.
*H03B 5/08* (2006.01)
*H03L 1/00* (2006.01)
*H03L 7/081* (2006.01)
*H03B 5/12* (2006.01)
*H03L 1/02* (2006.01)

(52) U.S. Cl.
CPC .......... *H03B 5/08* (2013.01); *H03B 5/12* (2013.01); *H03L 1/00* (2013.01); *H03L 1/026* (2013.01); *H03L 7/0812* (2013.01)

(58) Field of Classification Search
CPC ..... H01F 41/041; H01F 17/0066; H03B 5/08; H03B 5/12; H03L 7/0812; H03L 1/026; H03L 1/00
USPC ............... 336/200; 331/167, 117 FE, 117 R
See application file for complete search history.

(56) References Cited

U.S. PATENT DOCUMENTS

| | | | |
|---|---|---|---|
| 7,141,883 B2 | 11/2006 | Wei et al. | |
| 7,154,349 B2* | 12/2006 | Cabanillas | H03B 5/1218 331/117 FE |
| 7,236,024 B2 | 6/2007 | Huang et al. | |
| 7,310,039 B1 | 12/2007 | Zhang | |
| 7,498,656 B2 | 3/2009 | Zhang et al. | |
| 7,501,924 B2 | 3/2009 | Zhang | |
| 8,592,943 B2* | 11/2013 | Wu | H01L 27/08 257/277 |
| 8,648,664 B2 | 2/2014 | Eldredge et al. | |

(Continued)

OTHER PUBLICATIONS

Bunch, Ryan L. et al., "Quality Factor and Inductance in Differential IC Implementations," IEEE Microwave Magazine, Jun. 2002, 6 pages.

(Continued)

*Primary Examiner* — Arnold Kinkead
(74) *Attorney, Agent, or Firm* — Zagorin Cave LLP

(57) ABSTRACT

A low-complexity differential inductor and common-mode impedance network for reducing effects of flicker noise in an oscillator output signal have been disclosed. An oscillator includes a planar conductive loop comprising a first terminal, a second terminal, and a center tap. The planar conductive loop is formed from a first conductive layer above an integrated circuit substrate. The center tap is coupled to a first power supply node. The oscillator includes a planar conductive structure extending from a first point proximate to the center tap. The planar conductive structure extends along a line of symmetry of the planar conductive loop to a second point proximate to the first terminal and the second terminal. The planar conductive structure may be formed from the first conductive layer and may be directly coupled to the center tap.

19 Claims, 7 Drawing Sheets

(56) References Cited

U.S. PATENT DOCUMENTS

| | | |
|---|---|---|
| 9,543,068 B2 * | 1/2017 | Aboush ................. H03L 7/099 |
| 2004/0222478 A1 | 11/2004 | Zhang et al. |
| 2004/0222511 A1 | 11/2004 | Zhang |
| 2005/0269668 A1 | 12/2005 | Zhang |
| 2013/0257577 A1 | 10/2013 | Nazarian |
| 2015/0145607 A1 | 5/2015 | Caffee |

OTHER PUBLICATIONS

Darabi, Hooman, "Radio Frequency Integrated Circuits and Systems," Cambridge University Press, May 2015, 8 pages.
Shahmohammadi, Mina, et al., "A 1/f Noise Upconversion Reduction Technique Applied to Class-D and Class-F Oscillators;" IEEE International Solid-State Circuits Conference, 2015, pp. 444-445.
U.S. Appl. No. 14/722,607, filed May 27, 2015, entitled "Comb Terminals for Planar Integrated Circuit Inductor", naming Aaron J. Caffee as inventor.

* cited by examiner

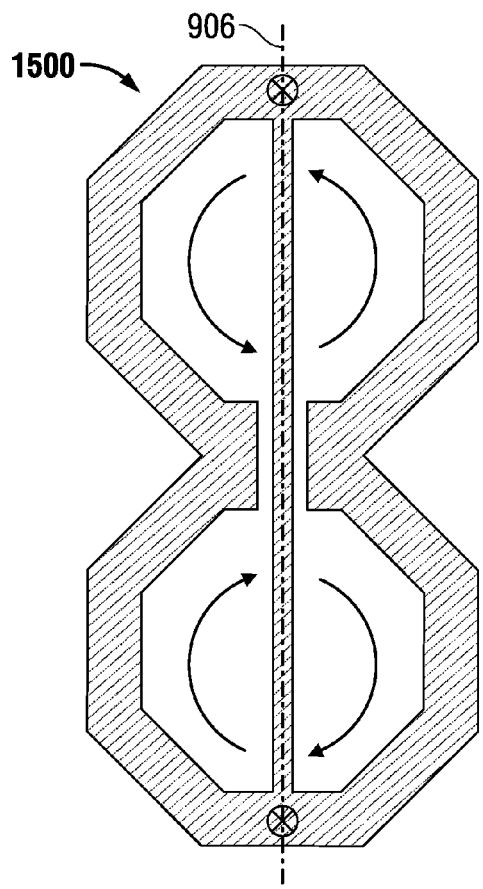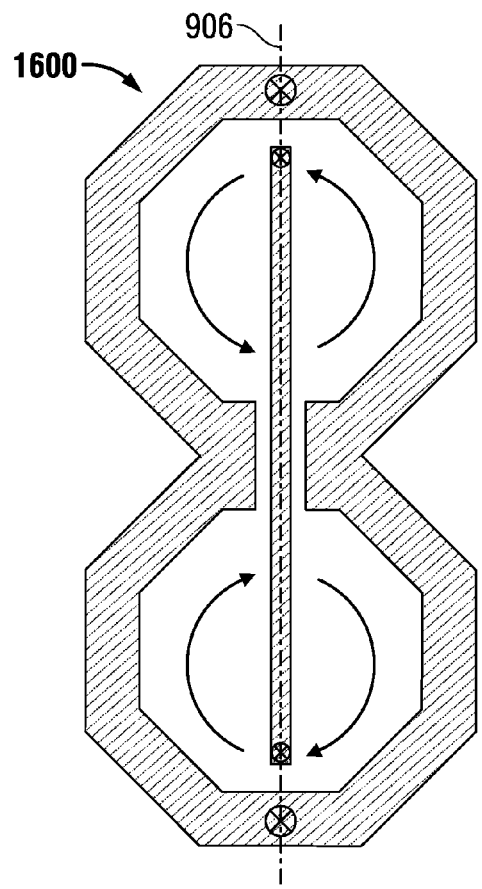
FIG. 15  FIG. 16
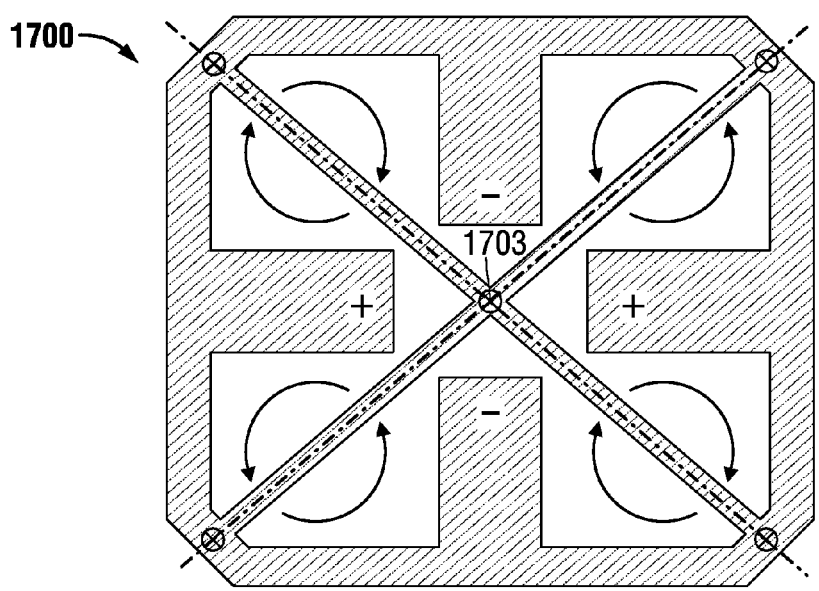
FIG. 17

US 9,813,023 B2

COMMON-MODE IMPEDANCE NETWORK FOR REDUCING SENSITIVITY IN OSCILLATORS

BACKGROUND

Field of the Invention

This invention relates to electronic devices and to oscillator circuits and more particularly to generating clock signals for electronic devices.

Description of the Related Art

In general, electronic oscillator circuits are used to generate repetitive oscillating electronic signals for a variety of integrated circuit applications (e.g., local oscillator signals for radio frequency mixers, transmitters for generating carrier waves for radio frequency signal transmission, etc.). Referring to FIG. 1, a clock generator circuit may use a conventional tank circuit, e.g., tank circuit 102, which is a tuned circuit including inductor 104 coupled to capacitor 106. Charge flows back and forth from the capacitor plates through the inductor so the tuned circuit can store electrical energy oscillating at its resonant frequency. Amplifier circuit 108 compensates for small losses in the tank circuit to sustain oscillation. By supplying a transconductance, $-G_m$, that is equal and opposite to the tank losses (modeled as $G_{loss}$), amplifier 108 is able to sustain oscillation indefinitely at the resonant frequency of the tank circuit and at an amplitude determined by the amplifier.

For oscillator applications that require low power for a particular performance level, the amplifier is typically biased to reduce or eliminate any excess gain. However, that amplifier bias point may vary as a function of environmental factors (e.g., temperature, strain, aging, etc.), causing the amplitude of the output signal to vary, and therefore, substantially degrade the oscillator performance. Automatic amplitude control techniques may be used to compensate for the effects of those environmental factors. Nevertheless, target performance (e.g., low power consumption for a particular amount of phase noise) may be difficult to achieve using conventional automatic amplitude control techniques. For example, flicker noise (i.e., 1/f noise) is low frequency noise that modulates the frequency of the oscillating signal. This low frequency noise may be upconverted and may cause the oscillator to operate outside of a target operating specification. When the oscillator is included as a voltage-controlled oscillator within a low bandwidth (e.g., less than 100 kHz) phase-locked loop (PLL), the PLL may not be able to suppress the phase noise of the voltage-controlled oscillator beyond the bandwidth of the PLL. Moreover, any coupling by other sources to the voltage-controlled oscillator that occurs outside of the bandwidth of the PLL may cause deterministic frequency noise or phase noise. When the oscillator is used as a free-running reference oscillator, a low quality factor (e.g., quality factor of approximately 20) of the LC oscillator may cause substantial phase noise and substantial frequency variation due to power supply variation, bias variations caused by mechanical stress or aging of the amplifier, or effects of nearby circuitry). Accordingly, improved oscillating signal generation techniques are desired.

SUMMARY OF EMBODIMENTS OF THE INVENTION

In at least one embodiment of the invention, an oscillator includes a planar conductive loop comprising a first terminal, a second terminal, and a center tap. The planar conductive loop is formed from a first conductive layer above an integrated circuit substrate. The center tap is coupled to a first power supply node. The oscillator includes a planar conductive structure extending from a first point proximate to the center tap. The planar conductive structure extends along a line of symmetry of the planar conductive loop to a second point proximate to the first terminal and the second terminal. The planar conductive structure may at least partially bisect the planar conductive loop. The planar conductive structure may be formed from the first conductive layer and may be directly coupled to the center tap. The planar conductive structure may be capacitively coupled to an AC ground node. The planar conductive structure may be capacitively coupled to the center tap of the conductive loop. The planar conductive structure may be directly coupled to an AC ground node. The planar conductive structure may include a plurality of conductive lines parallel to the line of symmetry and centered with respect to the line of symmetry. The planar conductive loop may have a line width at least an order of magnitude thicker than a second line width of the planar conductive structure. The planar conductive loop and the planar conductive structure may form at least a portion of a tank circuit of the oscillator. The common-mode resonant frequency $f_{ocm}$ of the tank circuit may be twice the differential-mode resonant frequency $f_{odm}$ of the tank circuit.

In at least one embodiment of the invention, a method for generating an oscillating signal includes conducting current in a planar conductive loop to generate a differential inductance. The method includes providing an AC component of the current from a center tap of the planar conductive loop to an AC ground potential using a planar conductive path extending along a line of symmetry of the planar conductive loop. Providing the AC component may include capacitively coupling a center tap of the planar conductor to a power supply node using the planar conductive path. The method may include generating an oscillating signal based on the current and the AC component.

BRIEF DESCRIPTION OF THE DRAWINGS

The present invention may be better understood, and its numerous objects, features, and advantages made apparent to those skilled in the art by referencing the accompanying drawings.

FIG. 15 illustrates a top view of an exemplary portion of a planar dual-loop inductor directly coupled to a planar conductor structure for manufacture according to design rules of an integrated circuit manufacturing process consistent with at least one embodiment of the invention.

FIG. 16 illustrates a top view of an exemplary portion of a planar dual-loop inductor capacitively coupled to a planar conductor structure for manufacture according to design rules of an integrated circuit manufacturing process consistent with at least one embodiment of the invention.

FIG. 17 illustrates a top view of an exemplary multi-loop inductor coupled to a planar conductor structure consistent with at least one embodiment of the invention.

The use of the same reference symbols in different drawings indicates similar or identical items.

DETAILED DESCRIPTION

Figure 1:
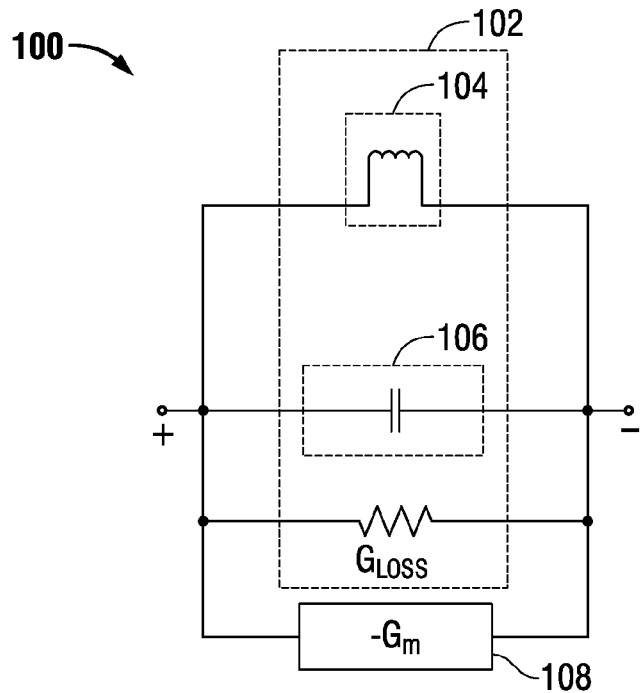
FIG. 1 illustrates a circuit model of a conventional LC oscillator.
Figure 2:
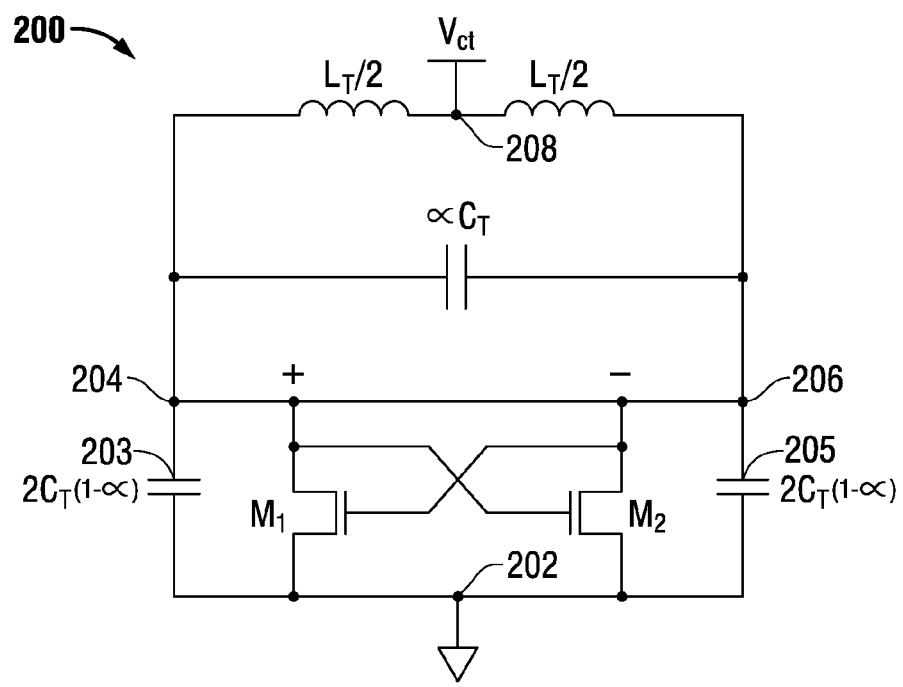
FIG. 2 illustrates a circuit diagram of a conventional LC oscillator circuit including an NMOS amplifier circuit.

In general, a conventional LC oscillator uses a differential circuit topology to reduce contributions of common-mode noise into the output oscillating signal and increase power-supply rejection of noise in high frequency signal applications (e.g., 100 MHz or greater). Referring to FIG. 2, LC oscillator 200 has a differential topology including two tank inductors having a combined inductance $L_T$, multiple tank capacitors having a combined capacitance $C_T$, which represents the capacitance seen at the gates of an oscillator amplifier, and transistors M1 and M2, which form the oscillator amplifier having a negative transconductance. The tank capacitance $C_T$ may include parasitic capacitance, fixed capacitance, variable capacitance, and/or other capacitances that may be predetermined or dynamically variable. The various tank capacitors (e.g., differential capacitors coupled to ground and a parallel capacitor) may have capacitances weighted based on weighting factor α. For example, the differential capacitors have capacitance of $2 \times C_T \times (1-\alpha)$ and the parallel capacitor has a capacitance of $\alpha \times C_T$. Transistors M1 and M2 are cross-coupled n-type transistors that implement a negative transconductance, $-G_m$, that compensates for the conductive losses of the tank circuit, $G_{loss}$. If $|-G_m|=|G_{loss}|$ then the LC oscillator 200 sustains oscillations. In a typical LC oscillator, $G_{loss}$ varies and the amplifier is designed to have, at near zero amplitude, $|-G_m|$ that is typically greater than $|G_{loss}|$ by a factor of approximately two or more, resulting in a negative $G_{total}$, to ensure the proper amplitude growth at startup. The amplifier operates in the negative transconductance regime and generates an oscillating signal in the current domain that transitions from sinusoidal behavior to square wave behavior with an increase in a bias signal level, which may be provided to LC oscillator 200 at center tap node 208, at the positive oscillator terminal at node 204, or at node 202, e.g., using a tail current source (not shown) coupled between node 202 and ground. If two identical inductors are used in a differential circuit, they may be replaced by a differential inductor that combines the two single inductors coupled to a common voltage at a terminal of each, which is a center tap of the differential inductor. The combination into a differential inductor results in a compact design consuming less area and having less substrate loss and capacitance than two separate inductors. In general, a center tap of an inductor is a contact made to a point halfway along a winding of the inductor.

The resonant frequency of the LC oscillator circuit is determined by the properties of the inductor and capacitor and is defined by the following relationship:

$$f_o = \frac{1}{2\pi\sqrt{L_T C_T}}$$

where $L_T$ is the total combined inductance of the tank inductors, $C_T$ is the total combined capacitance of the tank capacitors, and $f_o$ is the resonant frequency. The oscillating output signal has a fundamental frequency $f_0$ at the tank resonant frequency of the LC oscillator, but will also include harmonics. Those harmonics occur at frequencies higher than resonance and will be seen more by the capacitor than the inductor. Losses of the high frequency harmonics in the capacitor increase $G_{loss}$ and thus, those high frequency harmonics do not assist with sustaining oscillation.

Figure 3:
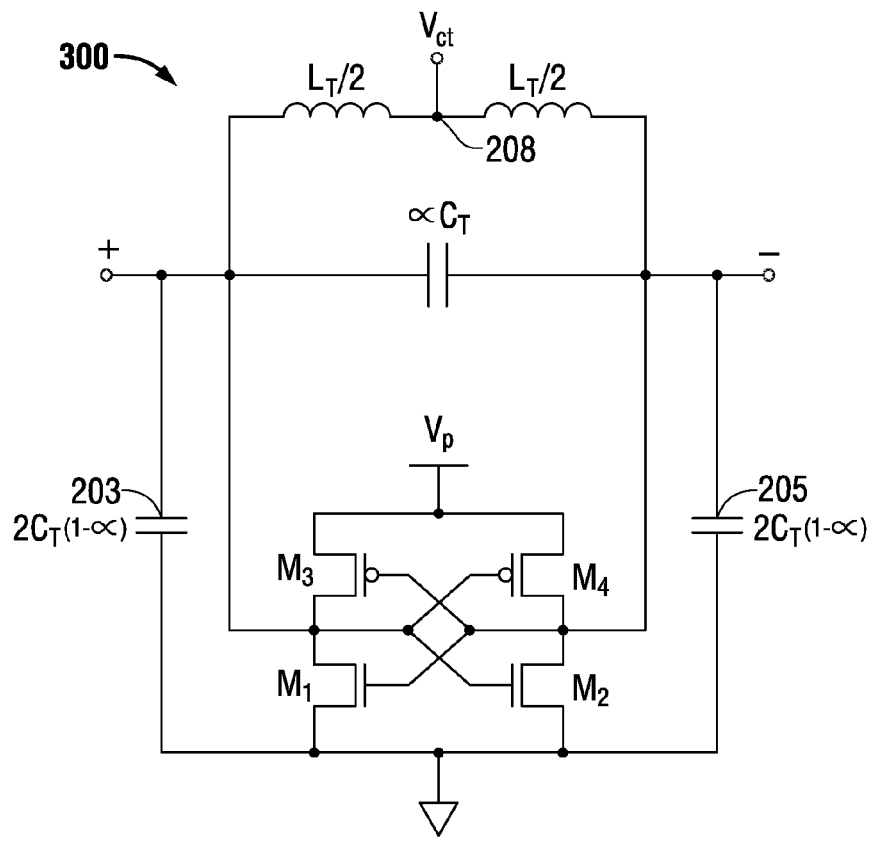
FIG. 3 illustrates a circuit diagram of a conventional LC oscillator circuit including a CMOS amplifier circuit.
Figure 4:
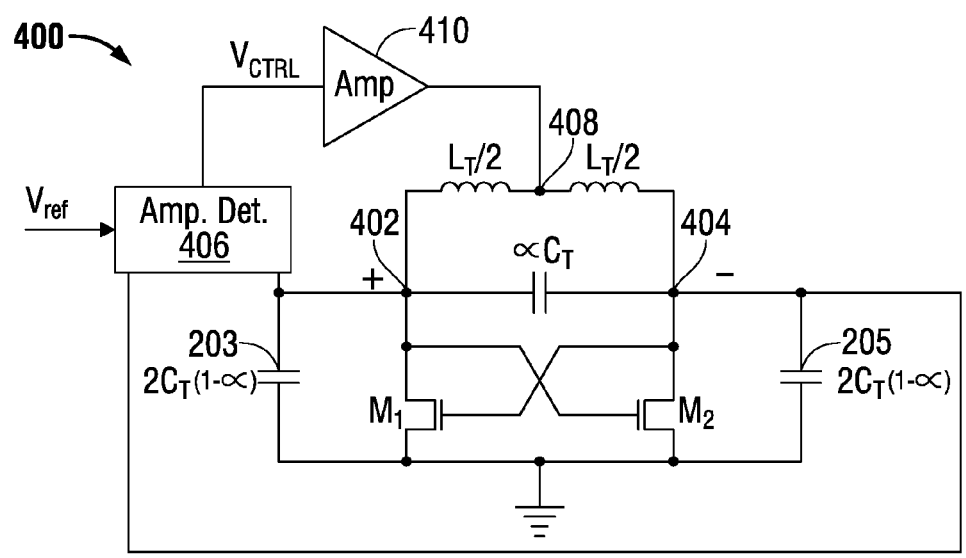
FIG. 4 illustrates a functional block diagram of an LC oscillator circuit coupled to an automatic amplitude control feedback circuit.

FIG. 3 illustrates another configuration of an LC oscillator including a CMOS amplifier. Direct control of amplifier biasing of oscillator 300 may use a regulated power supply coupled to node 208. Referring to FIG. 4, other techniques for determining amplifier bias may use indirect control of the amplifier bias. For example, an automatic amplitude control loop includes amplitude detector 406, which senses the peak amplitude of the oscillating signal. Amplifier 410 sets a bias signal voltage level for the oscillator amplifier (e.g., amplifier including transistors M1 and M2) via the center tap node 408 using amplitude reference voltage $V_{ref}$. Amplifier 410 may adjust the voltage on node 408, the center tap of the inductor, according to the peak amplitude of the oscillator output signal, which is detected by amplitude detector 406. For example, the amplitude of the oscillating signal varies as a function of temperature. As temperature increases, the negative feedback loop may increase $V_{CTRL}$ in response to a decreased detected peak, thereby increasing the oscillator bias signal level applied by amplifier 410 to the LC oscillator. Conversely, as temperature decreases, the negative feedback loop may decrease $V_{CTRL}$ in response to an increased detected peak, thereby decreasing the oscillator bias signal level applied by amplifier 410 to the LC oscillator.

In general, conventional LC oscillator analysis assumes that the oscillator output signal is sinusoidal and ignores any harmonics of the output waveform. However, in actual implementations, harmonics do exist in the oscillator output signal, although small, and may cause frequency pulling, i.e., cause variation of the frequency of the oscillator output signal. Frequency pulling may cause unwanted up-conversion of flicker noise and sensitivity to environmental factors such as mechanical strain and aging. For example, in the presence of the harmonic current, the capacitor of the tank circuit stores more energy than it would if the harmonics did not exist. Assuming the active circuit coupled to the tank circuit is memory-less, the inductor balances the extra energy, causing a downward shift in the frequency of oscillation, thereby allowing the inductor to store more electromagnetic energy. That harmonic current production of a downward shift in the oscillation frequency is known as the Groszkowski effect. Noise that modulates any harmonic of the output waveform will produce frequency noise that directly contributes to the shift in frequency.

In general, the tank circuit of a differential oscillator design has two distinct modes: a common mode and a differential mode. The common-mode impedance of the tank circuit is responsible for the phase and amplitude of even-order distortion. This even-order distortion may be affected by oscillator amplifier biasing. In general the oscillator amplifier loads the tank circuit of the LC oscillator and may cause frequency pulling. Techniques for reducing or eliminating loading of the tank circuit by the amplifier include using at least one additional inductor. For example, resonant tank degeneration is a technique where a parallel LC network that resonates at the second harmonic of the oscillator output signal is placed at the source side of the core amplifier. However, effective resonant tank degeneration consumes considerable area for high Q components. Noise-filtering oscillator topologies have the advantages of reducing or eliminating loading from the tank circuit while introducing little or no noise from a tail current source that has low headroom requirements. However, noise filtering topologies typically include an additional inductor, e.g., an additional inductor coupled in series with a tail current source. The use of an additional inductor consumes substantial area of an integrated circuit and increases system cost.

If the tank circuit is designed to have a common-mode resonance frequency that is twice the differential-mode resonance frequency of the tank circuit (i.e., $f_{ocm}=2 \times f_{odm}$), all of the benefits of a noise filtering oscillator topology (e.g., the tail current source introduces little or no noise, amplifier does not substantially load the tank circuit, and low headroom requirement of the tail current source) may be reaped without the need for an additional inductor. The differential inductor may be implemented by coupling a reference signal to a center tap of a planar conductive loop. For example, a single planar loop inductor may be configured as a differential inductor by tapping the planar loop at a central node and no additional inductor is needed. A technique that implements matching the common-mode resonant frequency $f_{ocm}$ to match twice the differential-mode resonant frequency $f_{odm}$ of the tank circuit includes coupling an impedance circuit between the center tap of the differential inductor to an AC ground node. By incorporating such common-mode impedance network, the intra-modulation of even-order distortion with signal at the fundamental oscillation frequency may be directly addressed to reduce frequency pulling due to changes in oscillator bias. As a result, the technique reduces flicker noise up-conversion while also addressing other effects causing frequency pulling, such as frequency pulling due to mechanical strain and aging, thereby improving the frequency accuracy of a stand-alone LC oscillator.

Figure 5:
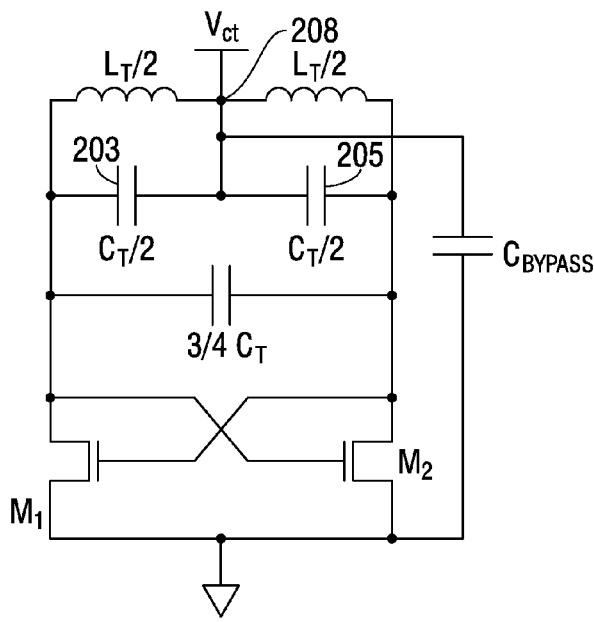
FIG. 5 illustrates a circuit diagram of a conventional LC oscillator circuit including a common-mode impedance network.
Figure 6:
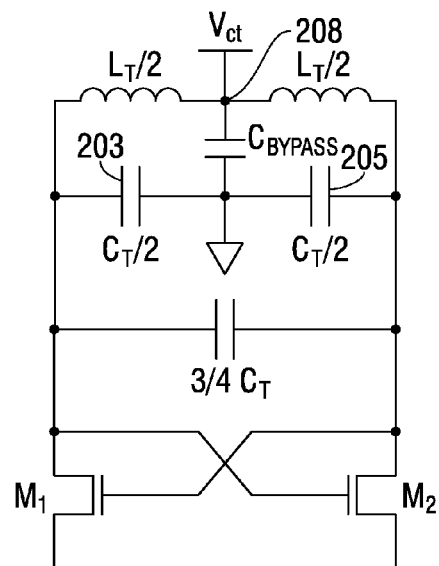
FIG. 6 illustrates a circuit diagram of a conventional LC oscillator circuit including a common-mode impedance network.

Referring to FIG. 5, an exemplary common-mode impedance network includes coupling bypass capacitance $C_{BYPASS}$ to the center tap of the tank inductor to a ground node. Bypass capacitance $C_{BYPASS}$ is coupled in series combination with capacitors 203 and 205, which act in parallel in the common mode. Those capacitances have values that are selected to cause the common-mode resonant frequency $f_{ocm}$ of the tank circuit to be approximately twice the differential-mode resonant frequency $f_{odm}$ of the tank circuit. In at least one embodiment of an oscillator circuit, bypass capacitance $C_{BYPASS}$ is selected to have a high enough capacitance to provide a low or negligible impedance to effectively be a short circuit at $2 \times f_{odm}$ and the selection of weighting factor $\alpha$ determines common-mode resonant frequency $f_{ocm}$ of the tank circuit. The common-mode inductance is $L_T/4$ in the presence of the common-mode impedance network. The common-mode impedance network serves as an AC ground node, i.e., returns AC current to ground. Referring to FIG. 6, another embodiment of a common-mode impedance network includes bypass capacitance $C_{BYPASS}$ coupled between the center tap of the inductor and an AC ground node. Similarly, weighting factor $\alpha$ and bypass capacitance $C_{BYPASS}$ have values that are selected to cause the common-mode resonant frequency form of the tank circuit to be approximately twice the differential-mode resonant frequency $f_{ocm}$ of the tank circuit.

Figure 7:
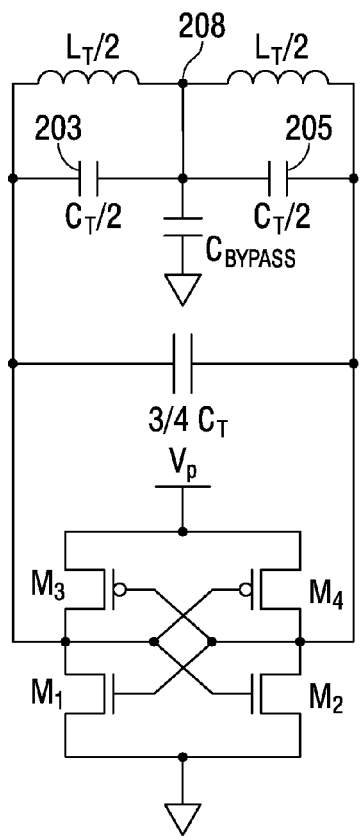
FIG. 7 illustrates a circuit diagram of a conventional LC oscillator circuit including a common-mode impedance network.

Referring to FIG. 7, the technique may also be used in LC oscillator implementations that include a CMOS amplifier. The center tap is shorted to an AC ground node. Weighting factor $\alpha$ and bypass capacitance $C_{BYPASS}$ have values that are selected to cause the common-mode resonant frequency $f_{ocm}$ of the tank circuit to be approximately twice the differential-mode resonant frequency $f_{odm}$ of the tank circuit. Weighting factor $\alpha$ and bypass capacitance $C_{BYPASS}$ may be implemented by a plurality of capacitors that are selectively enabled by one or more control signals generated based on information received from external to the oscillator circuit. In other embodiments, the oscillator includes other suitable combinations of bypass capacitance $C_{BYPASS}$ between center tap 208 and the ground node, a bypass capacitance coupled between center tap 208 and power supply $V_P$, and a bypass capacitance from power supply $V_P$ to a ground node.

Note that the differential LC oscillator topologies of FIGS. 5-7 are exemplary only and other embodiments of differential LC oscillators including a common-mode impedance circuit coupled to the inductor center tap to cause the common-mode resonant frequency $f_{ocm}$ of the tank circuit to be approximately twice the differential-mode resonant frequency $f_{odm}$ of the tank circuit may be used consistent with techniques described herein. For example, although FIGS. 5 and 6 illustrate NMOS-only amplifier circuits and FIG. 7 illustrates a CMOS amplifier circuit, one of skill in the art will appreciate that the teachings herein can be utilized with other amplifier circuit implementations and variations and modifications of the embodiments disclosed herein, may be made based on the description set forth herein, e.g., a PMOS amplifier circuit may be used and a center tap of an inductor may be coupled to a ground power supply node. Using a differential inductor, partitioning the tank capacitor into capacitances weighted according to weighting factor α, and using a bypass impedance to cause the common-mode resonant frequency $f_{ocm}$ of the tank circuit to be approximately twice the differential-mode resonant frequency $f_{odm}$ of the tank circuit reduces oscillator area requirements and therefore reduces cost of the oscillator as compared to oscillators that implement other noise filtering techniques for reducing flicker noise.

In general, an inductor includes an input, an output, and a coil disposed therebetween through which current rotates. The coil introduces inductance into an electrical circuit, to produce magnetic flux. As referred to herein, a coil is a conductor having at least a fractional number of turns around a core region of space. An individual turn of an exemplary coil may be defined by a curve traced by the tip of a position vector, e.g., R(t)=x(t)i+y(t)j+z(t)k from t=a to t=b. As referred to herein, one full turn of the coil is defined by a portion of the curve as t runs from 0 to 2π. However, an exemplary coil may make any number of full turns or fractional turns. For example, less than one full turn, i.e., R(t) for 0<t<2π, may form the coil. Small inductors with a good quality factor ($Q_L$) have been very difficult to design given modern integrated circuit design restrictions. Traditionally, integrated circuit inductors are designed to be metal traces forming planar loops (e.g., spiral inductors).

The quality factor associated with the resonant circuit (i.e., $Q_{RESONANT}$) describes the ability of the circuit to produce a large output at a resonant frequency and also describes the selectivity of the circuit. The $Q_{RESONANT}$ may be substantially affected by the quality factor of an inductor (i.e., $Q_L$) included in the resonant circuit. In general, $Q_L$ for an inductor modeled as an inductance in series with a resistance is $$Q_L = \frac{\omega L}{R}$$

where ω is the angular frequency of oscillation, L is the inductance of the inductor, and R is the effective series resistance of the inductor. As resistance of the conductive loop increases, $Q_L$ decreases. Higher Q systems dissipate less power and result in increased battery life than lower Q systems in portable applications.

Figure 8:
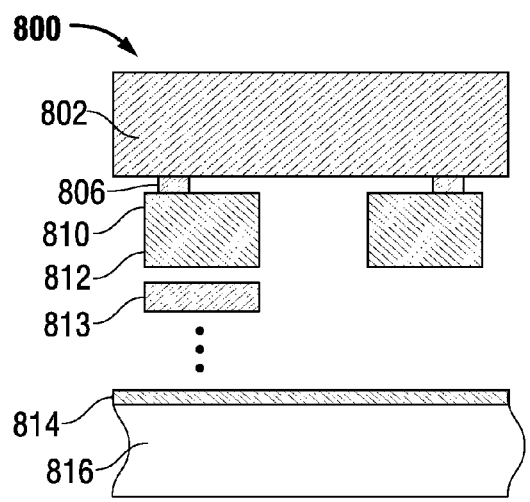
FIG. 8 illustrates a cross-sectional view of a portion of an oscillator structure formed above a substrate consistent with at least one embodiment of the invention.
Figure 9:
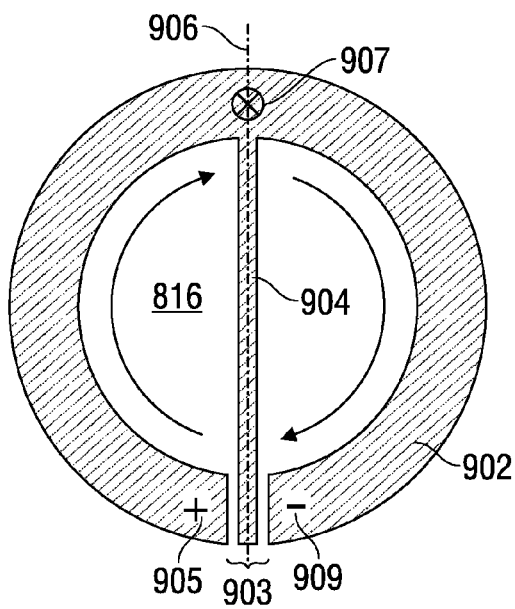
FIG. 9 illustrates a top view of an exemplary planar inductor structure including a planar conductor structure consistent with at least one embodiment of the invention.

Referring to FIGS. 8 and 9, a technique for implementing the differential inductance and common-mode impedance network described above includes planar conductive loop 802, which is a planar loop formed from a conductive layer disposed above semiconductor substrate 816. In general, since inductance is a function of area, and equivalent series resistance tends to be a function of perimeter under low substrate-loss conditions (e.g., high substrate resistivity below the inductor), a loop-shaped conductor is used to implement the inductor to maximize the ratio of inductance to resistance. The loop shape of the conductor results in the greatest cross-sectional area to perimeter ratio for the inductor and thus, maximizes Q of the inductor.

Planar conductive loop 902 may be formed in conductive layer 802. Conductive layer 802 has low resistivity and may be a topmost metal layer in an integrated circuit manufacturing process. In at least one embodiment of a planar conductive loop, conductive layer 802 is an ultra-thick layer formed above semiconductor substrate 816. In general, an ultra-thick layer may include dielectric and conductive layers formed on an integrated circuit substrate below any passivation layer and below any integrated circuit bonding pads, if present. However, an ultra-thick layer may be formed on an integrated circuit die in the absence of a passivation layer or bonding pads. Ultra-thick layers typically have thicknesses substantially greater than the thicknesses of typical dielectric and conductive layers formed in lower layers of an integrated circuit stack. For example, typical conductive layer 814 of an integrated circuit is less than 1 μm thick. However, conductive layer 802 in an exemplary ultra-thick conductive layer that is at least 3.3 μm thick and corresponding dielectric layers are at least 0.65 μm thick. Ultra-thick dielectric layers may include silicon nitride, oxynitride, silicon oxide, or other suitable materials. Ultra-thick conductive layers may include aluminum, copper, polysilicon, or other suitable conductive materials.

In at least one embodiment of the present invention, an ultra-thick conductive layer is separated from traditional integrated circuit layers (e.g., typical conductor layers 814 and 813) by a transitional layer or layers that improve manufacturability. Transitional conductive layer 810 has a thickness less than a thickness of the ultra-thick conductive layer, but greater than a thickness of traditional conductive layer 813 or traditional conductive layer 814. Transitional layers may include a thick conductive layer and a thick dielectric layer and may be formed of any suitable material (e.g., silicon nitride, oxynitride, silicon oxide, aluminum, copper, polysilicon). A typical manufacturing technology uses few ultra-thick conductive layers and limits those layers to top metallization layers. A typical ultra-thick conductive layer is formed from a conductive material (e.g., 3 μm thick copper) that has a higher conductivity than the conductive material forming lower conductive layers (e.g., 1 μm thick transitional layer formed from aluminum).

In general, typical integrated circuit manufacturing processes do not stack multiple ultra-thick conductive layers due to manufacturability issues (e.g., stresses causing delamination). Accordingly, the next adjacent conductive layer beneath the ultra-thick conductive layer typically has lower thickness and/or is formed from a different material, which results in the next adjacent conductive layer having a higher resistivity than the conductive layer used to form planar conductive loop 902. However, the physical design of planar conductive loop 902 and associated connectivity structures result in a substantial amount of current routing in the next adjacent conductive layer, which increases the resistance in series with planar conductive loop 902 and impacts (e.g., reduces) the Q of the resulting system.

Conductors formed in transitional conductive layer 810 may be used to form one or more capacitors. The one or more capacitors may include transistor capacitors and may be formed in the active area of the integrated circuit along with the one or more amplifiers. The one or more capacitors may be other integrated circuit capacitors, e.g., "finger" capacitors, formed by a plurality of densely-spaced, substantially parallel metal lines, i.e., "fingers." Alternating ones of the fingers are coupled to form the plates of the capacitor. A capacitor or other integrated circuit element coupled to the inductor may be formed in any combination of conductive layers on the integrated circuit and coupled by conductive vias to any suitable portion of planar conductive loop 902 to provide any suitable current path.

Ideally, planar conductive loop 902 is not coupled in series with any resistance. However, since the material of the ultra-thick conductive layer has a finite conductivity and lower conductive layers of the integrated circuit have lower conductivity than the ultra-thick layer (e.g., due to smaller thicknesses and/or use of lower conductivity materials), electrically coupling the inductor to other integrated circuit elements using those lower layers may substantially increase the resistance in series with conductive loop 200 and thus, reduces the Q of the associated inductor system.

Still referring to FIG. 9, planar conductive loop 902 includes gap 903 in the conductive material to facilitate establishing a differential voltage across planar conductive loop 902, e.g., using positive terminal 905 and negative terminal 909 of planar conductive loop 902 to couple planar conductive loop 902 to an associated circuit, typically formed below the inductor. For example, one or more capacitors and/or one or more amplifiers are coupled in parallel to conductive loop 902. A first capacitor having capacitance $C_T/2$ may be formed in integrated circuit layers below conductive loop 902 and have a first terminal coupled to the positive terminal 905 and a second terminal coupled to planar conductive structure 904 and a second capacitor having capacitance $C_T/2$ may be formed in the integrated circuit layers below conductive loop 902 and have a first terminal coupled to planar conductive structure 904 and a second terminal coupled to negative terminal 909. A capacitor having bypass capacitance $C_{BYPASS}$ may be formed in integrated circuit layers below conductive loop 902 and coupled between planar conductive structure 904 and a ground node. In at least one embodiment of planar conductive loop 902, gap 903 has an approximately constant width. A portion of the common-mode impedance network, planar conductive structure 904, may be formed in the same conductive layer as planar conductive loop 902 or in a conductive layer beneath planar conductive loop 902 and coupled to planar conductive loop 902 by inter-level interconnect.

Figure 10:
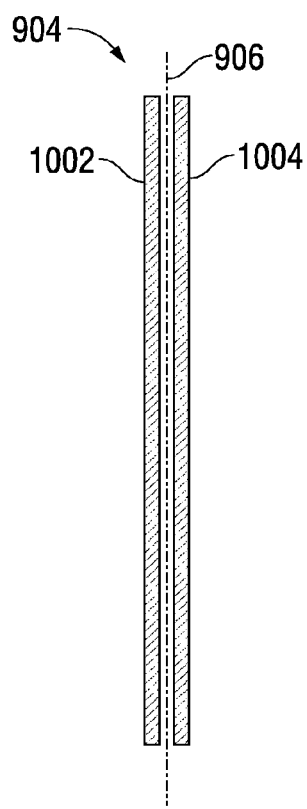
FIG. 10 illustrates a top view of an exemplary portion of a planar conductor structure of FIG. 9 consistent with at least one embodiment of the invention.
Figure 11:
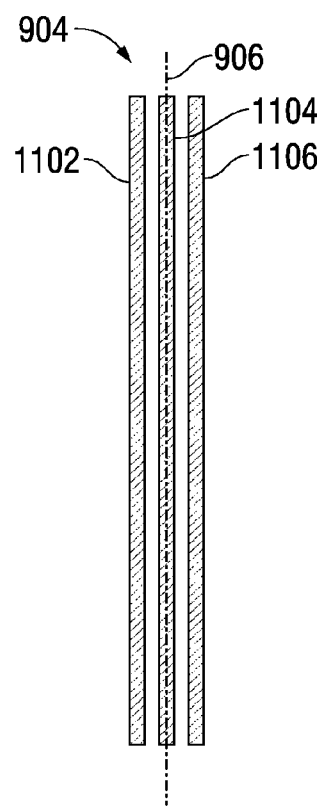
FIG. 11 illustrates a top view of an exemplary portion of a planar conductor structure of FIG. 9 consistent with at least one embodiment of the invention.

Referring to FIGS. 9, 10, and 11, planar conductive structure 904 extends from a point proximate to center tap 907 of planar conductive loop 902, along an axis of symmetry of planar conductive loop 902 to a point proximate to (e.g., between or otherwise equidistant to) the terminals of planar conductive loop 902. Accordingly, planar conductive structure 904 may at least partially bisect planar conductive loop 902. The symmetry of the planar conductive structure 904 with respect to planar conductive loop 902 reduces the effects of external electromagnetic forces on the inductance of planar conductive loop 902, thereby reducing any quality factor degradation of the inductor due to inclusion of planar conductive structure 904 and reduces the need for a separate shielding structure for the tank circuit.

Although illustrated in FIG. 9 as a single planar conducting path directly coupled to center tap 907 of the planar conductive loop 902 by formation of the conductive material as an extension from center tap 907, planar conductive structure 904 may be formed in other integrated circuit layers and may be coupled to planar conductive loop 902 using inter-level interconnect. In addition, planar conductive structure 904 may be formed from multiple planar conducting paths (e.g., planar conducting paths 1002 and 1004 of FIG. 10 or planar conducting paths 1102, 1104, and 1106 of FIG. 11) directly coupled to center tap 907 and centered about the axis of symmetry 906 of planar conductive loop 902. Use of multiple planar conductive paths (e.g., FIGS. 10 and 11) that have narrower line widths than a planar conductive structure 904 formed from a single planar conductive path (e.g., FIG. 9) may reduce formation of eddy currents in planar conductive structure 904 due to external electromagnetic forces that couple electromagnetic interference into the oscillator system, thereby decreasing any reduction in oscillator Q as a result of including planar conductive structure 904 into the oscillator.

Referring to FIGS. 10 and 11, the gap between adjacent planar conducting paths 1002 and 1004 of planar conductive structure 904 may be as small as manufacturability design rules allow, e.g., on the order of the thickness of the conductive layer in which the gap is formed, or greater than (e.g., up to ten times greater than) the minimum spacing allowed by the manufacturability design rules. The gap may be filled with a dielectric material (e.g., oxide, nitride, or other suitable electrically insulating material) or gas (e.g., air). Note that other embodiments of planar conductive structures include other numbers of planar conducting paths of the planar conductive structure and may include planar conductive structures in a layer with lower conductivity than the layer of the loop. The other numbers of planar conducting paths may have different widths. In addition, other numbers of conductive loops may be coupled in parallel or series to form an inductor structure having a target inductance.

Figure 12:
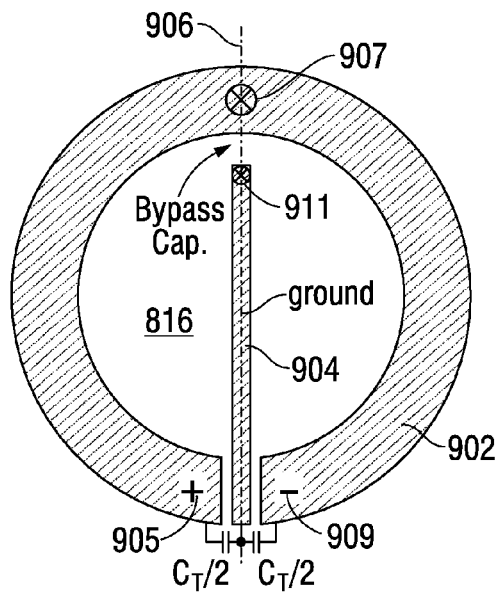
FIG. 12 illustrates a top view of an exemplary portion of a planar inductor capacitively coupled to a planar conductor structure consistent with at least one embodiment of the invention.

Referring to FIG. 12, in at least one embodiment of planar conductive loop 902, center tap 907 is indirectly coupled to the planar conductive structure 904. For example, planar conductive loop 902 is coupled to a bypass capacitor formed in other integrated circuit layers (e.g., using inter-level interconnect coupled to center tap 907) and the bypass capacitor is coupled to planar conductive structure 904 (e.g., by inter-level interconnect coupled to contact 911), which is coupled to an AC ground node coupled between the tank capacitors formed in other integrated circuit layers.

Figure 13:
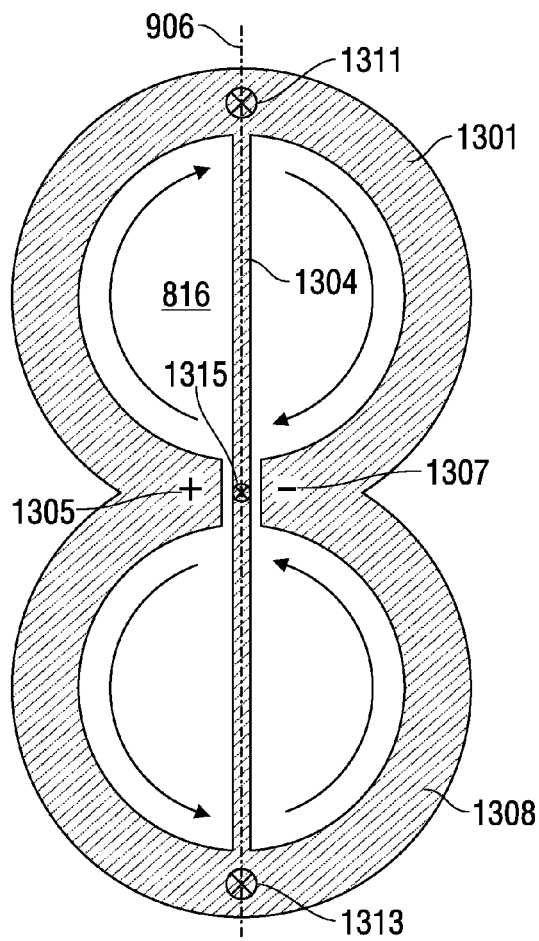
FIG. 13 illustrates a top view of an exemplary portion of a planar dual-loop inductor directly coupled to planar conductor structures consistent with at least one embodiment of the invention.
Figure 14:
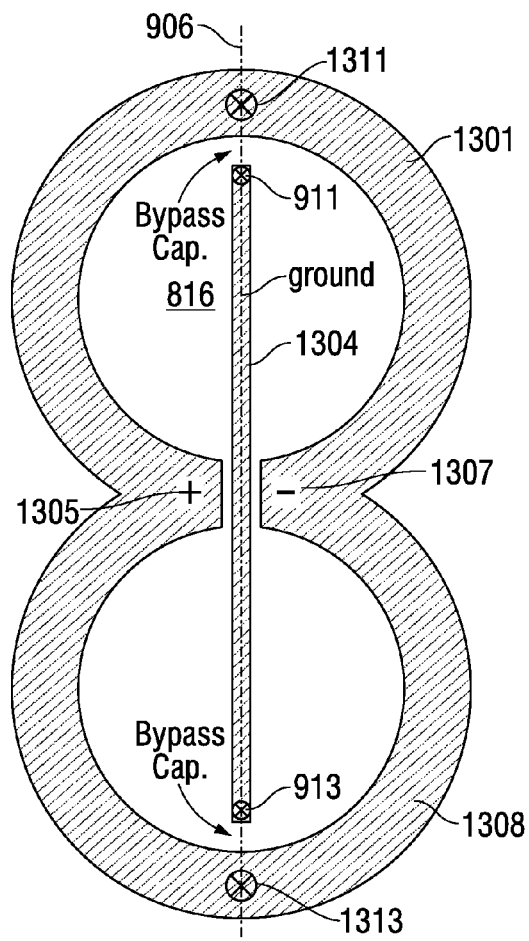
FIG. 14 illustrates a top view of an exemplary portion of a planar dual-loop inductor capacitively coupled to a planar conductor structure consistent with at least one embodiment of the invention.

In general, $Q_{RESONANT}$ of a resonant circuit is inversely related to interference from external sources. A technique for reducing the effect of electromagnetic interference on an inductor structure includes implementing the inductor structure using a two-loop arrangement. Referring to FIGS. 13 and 14, an inductor is formed using two parallel-connected planar conductive loops (e.g., planar conductive loop 1301 having center tap 1311 and planar conductive loop 1308 having center tap 1313) having positive terminal 1305 and negative terminal 1307. The two-loop arrangement is less susceptible to external electromagnetic interference (e.g., far field interference sources in particular) because induced current flow in one such coil (e.g., planar conductive loop 1301 or planar conductive loop 1308) is offset by an opposite current flow induced in the other coil (e.g., planar conductive loop 1308 or conductive loop 1301, respectively). The planar conductive loops may be directly coupled to planar conductive structure 1304, as illustrated in FIG. 13, or capacitively coupled to planar conductive structure 1304 using bypass capacitors coupled to contacts 911 and 913, as illustrated in FIG. 14. Planar conductive structure 1304 is coupled to an AC ground node, e.g., by coupling bypass capacitance $C_{BYPASS}$ between contact 1315 and a ground node. Planar conductive structure 1304 extends along axis of symmetry 906 from center tap 1311 of planar conductive loop 1301 or a point proximate to center tap 1311 of planar conductive loop 1301 to center tap 1313 of planar conductive loop 1308 or a point proximate to center tap 1313 of planar conductive loop 1308. Planar conductive structure 1304 may be formed from multiple planar conductive structures, as described above with reference to FIGS. 10 and 11.

Although a circular conductive loop has a target area to perimeter ratio, manufacture of circular loops may not be practicable in typical integrated circuit manufacturing technologies. Accordingly, a circular conductive loop may be approximated by physical designs of planar conductive loops having other geometries (e.g., square, octagonal, or other symmetric, polygonal shape). For example, referring to FIGS. 15 and 16, planar conductive loop 1500 and planar conductive loop 1600 include planar conductive loops each having an octagonal shape that may be realized in manufacturing technologies that allow for formation of conductive lines forming angles in multiples of 45 degrees. However, note that other geometric shapes may be used. Planar conductive loops of varying geometries may be directly coupled to corresponding planar conductive structures, as illustrated in FIG. 15, or capacitively coupled to corresponding planar conductive structures, which are coupled to an AC ground node, as illustrated in FIG. 16. One or more planar conductive structures extend along the axis of symmetry of the corresponding planar conductive loops from a point proximate to a center tap of a first planar conductive loop, between positive and negative terminals of the corresponding planar conductive loop, to a point proximate to a center tap of a second planar conductive loop.

Figure 19:
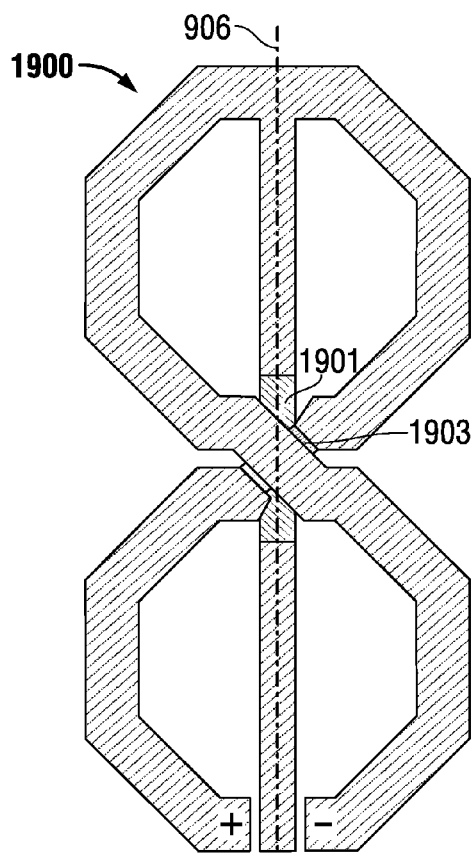
FIG. 19 illustrates a top view of an exemplary series dual-loop inductor coupled to a planar conductor structure for manufacture according to design rules of an integrated circuit manufacturing process consistent with at least one embodiment of the invention.
Figure 20:
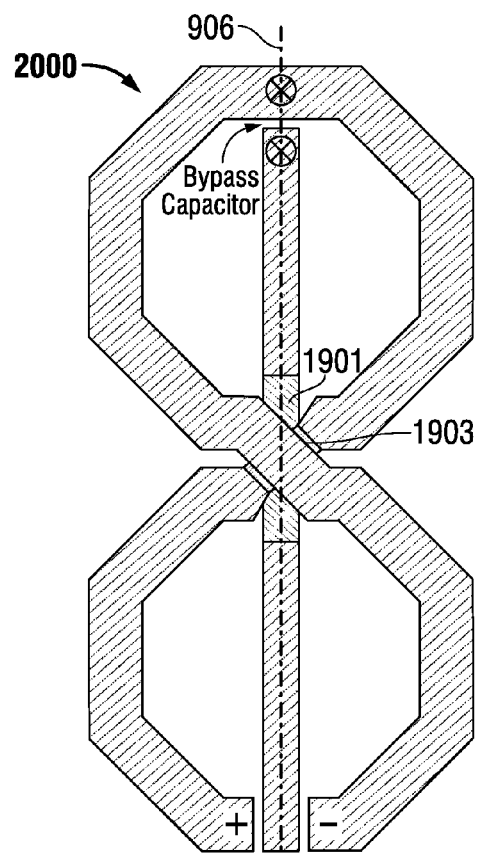
FIG. 20 illustrates a top view of an exemplary series dual-loop inductor capacitively coupled to a planar conductor structure for manufacture according to design rules of an integrated circuit manufacturing process consistent with at least one embodiment of the invention.

In addition, rather than forming a parallel conductive dual-loop arrangement that couples two planar conductive loops in parallel, as illustrated in FIGS. 13-16, in other embodiments of a differential inductor and common-mode impedance structure, the two loops are coupled in series, as illustrated in FIGS. 19 and 20. Such dual-loop arrangements may increase the inductance by approximately four times the inductance of similar parallel dual-loop arrangements of FIGS. 13-16. Conductive structures 1900 and 2000 each include a positive terminal and a negative terminal of a corresponding planar conductive loop disposed at one end of the dual-loop arrangement. Conductive structures 1900 and 2000 each include a planar conductive structure of the common-mode impedance structure that may be substantially formed in the same conductive layer of an integrated circuit as the associated planar conductive loops and may be directly coupled to a center tap of the conductive loop. Conductive structures 1900 and 2000 include conductive loop portion 1903 that is formed in an adjacent conductive layer to provide a separate conducting path at a crossover portion of the planar conductive loop. That adjacent conductive layer may be the layer with the next lowest sheet resistance to reduce any impact on the Q of the differential inductor. The planar conductive structure includes conductive portion 1901 that is formed in a conductive layer adjacent to the conductive loop portion. A planar conductive structure of the common-mode impedance structure may be directly coupled to a center tap disposed at one end of the dual-loop structure, as illustrated in FIG. 19, or indirectly coupled to a center tap using a bypass capacitor disposed at one end of the dual-loop structure, as illustrated in FIG. 20. The planar conductive structure extends along an axis of symmetry of the dual-loop structure, and is directly or indirectly coupled to a point proximate to the positive and negative terminals at the opposing end of the dual-loop structure, thereby at least partially bisecting the dual-loop structure. Although FIGS. 19 and 20 illustrate the planar conductive structure being formed to cross under the planar conductive loop using a conductive layer beneath the planar conductive loop, in other embodiments of conductive structures 1900 and 2000, conductive structure 1901 of the planar conductive structure is formed in a higher conductive layer (e.g., a redistribution layer, which may be formed from aluminum and have a thickness of 1 μm or greater) and crosses over the inductor cross-under structure including conductive loop portion 1903. In addition, other embodiments of conductive structures 1900 and 2000 may include conductive structure 1903 being formed to cross over the planar conductive loop using a next adjacent conductive layer above planar conductive loop 1900 or 2000 with conductive structure 1901 being formed in a next adjacent conductive layer beneath planar conductive loop 1900 or 2000, but in a higher level conductive layer than in FIGS. 19 and 20.

Figure 18:
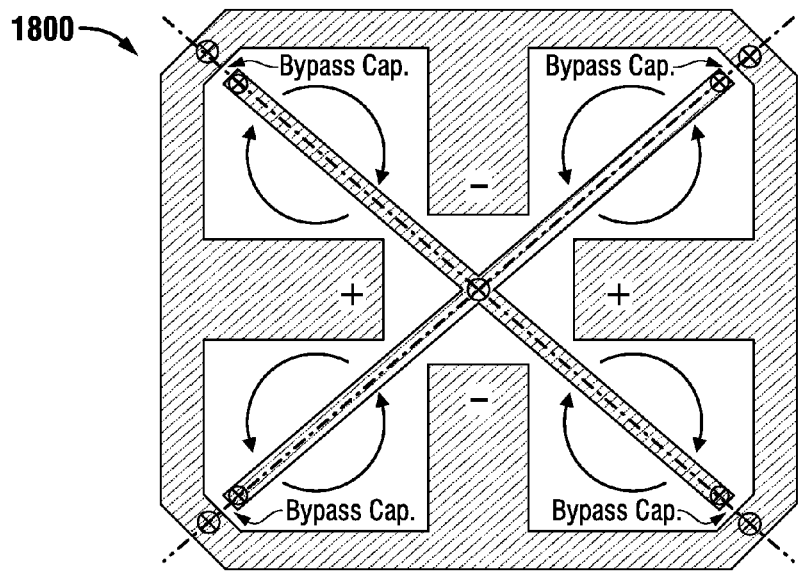
FIG. 18 illustrates a top view of an exemplary multi-loop inductor capacitively coupled to a planar conductor structure consistent with at least one embodiment of the invention.

In at least one embodiment of a differential inductor and common-mode impedance structure, additional loops may be used to realize a target inductance for a particular application. For example, referring to FIG. 17, conductive structure 1700 includes four planar conductive loops coupled in parallel with each other, each having a center tap coupled to a planar conductive structure extending along an axis of symmetry. Bypass capacitance $C_{BYPASS}$ may be formed beneath conductive structure 1700 and coupled between contact 1703 of the planar conductive structure and a ground node. Referring to FIG. 18, conductive structure 1800 includes four planar conductive loops coupled in parallel with each other. Each of the four planar conductive loops has a center tap capacitively coupled to a planar conductive structure extending along an axis of symmetry using a bypass capacitor coupled to a ground node. The bypass capacitors are formed in integrated circuit layers beneath conductive structure 1800. Currents flowing in adjacent conductive loops of conductive structures 1700 and 1800 of FIGS. 17 and 18 rotate in opposite directions thereby reducing susceptibility of the resulting inductor to electromagnetic interference.

Thus various embodiments of a low-complexity differential inductor and a common-mode impedance network for reducing effects of flicker noise in an oscillator output signal have been disclosed. The described topologies are simple to design, do not require high Q components, have reduced area, are manufacturable in typical integrated circuit manufacturing processes, and have reduced power consumption as compared to other techniques for reducing effects of flicker noise in an oscillator output signal. In addition, the technique may reduce bias sensitivity due to other factors, e.g., mechanical strain and aging and frequency pulling due to power supply level variation.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in embodiments in which differential inductors have particular physical geometries for manufacture using particular integrated circuit manufacturing processes, one of skill in the art will appreciate that the teachings herein can be utilized with other physical geometries consistent with other integrated circuit manufacturing processes. Variations and modifications of the embodiments disclosed herein, may be made based on the description set forth herein, without departing from the scope of the invention as set forth in the following claims.

What is claimed is:

1. An oscillator comprising:
   a planar conductive loop comprising a first terminal, a second terminal, and a center tap, the planar conductive loop being formed from a first conductive layer above an integrated circuit substrate; and
   a planar conductive structure extending from a first point proximate to the center tap and extending along a line of symmetry of the planar conductive loop to a second point proximate to the first terminal and the second terminal,
   wherein the center tap is capacitively coupled to an AC ground node using the planar conductive structure, the planar conductive structure is capacitively coupled to the center tap of the planar conductive loop, and the planar conductive structure is directly coupled to the AC ground node.

2. The oscillator as recited in claim 1, wherein the planar conductive structure at least partially bisects the planar conductive loop.

3. The oscillator as recited in claim 1, wherein the planar conductive structure is formed from the first conductive layer and is directly coupled to the center tap.

4. An oscillator comprising:
   a planar conductive loop comprising a first terminal, a second terminal, and a center tap, the planar conductive loop being formed from a first conductive layer above an integrated circuit substrate; and
   a planar conductive structure extending from a first point proximate to the center tap and extending along a line of symmetry of the planar conductive loop to a second point proximate to the first terminal and the second terminal,
   wherein the first terminal is coupled to a first tank capacitor directly coupled to the planar conductive structure and the second terminal is coupled to a second tank capacitor directly coupled to the planar conductive structure.

5. The oscillator as recited in claim 4, wherein the planar conductive structure is capacitively coupled to the center tap of the planar conductive loop.

6. The oscillator as recited in claim 5, further comprising:
   a bypass capacitor coupled between the center tap and the planar conductive structure.

7. The oscillator as recited in claim 5, wherein the planar conductive structure is directly coupled to the AC ground node.

8. The oscillator as recited in claim 4, wherein the planar conductive structure is capacitively coupled to the AC ground node.

9. The oscillator as recited in claim 1, further comprising:
   an additional planar conductive loop coupled to the first terminal and the second terminal, the planar conductive structure extending from a point between the first terminal and the second terminal to a second center tap of the additional planar conductive loop along the line of symmetry of the planar conductive loop and the additional planar conductive loop.

10. An oscillator comprising:
    a planar conductive loop comprising a first terminal, a second terminal, and a center tap, the planar conductive loop being formed from a first conductive layer above an integrated circuit substrate; and
    a planar conductive structure extending from a first point proximate to the center tap and extending along a line of symmetry of the planar conductive loop to a second point proximate to the first terminal and the second terminal,
    wherein the center tap is capacitively coupled to an AC ground node using the planar conductive structure,
    wherein the planar conductive structure comprises a plurality of conductive lines parallel to the line of symmetry and centered with respect to the line of symmetry.

11. The oscillator as recited in claim 10, wherein the plurality of conductive lines includes an even number of conductive lines disposed on opposing sides of the line of symmetry.

12. The oscillator as recited in claim 11, wherein the plurality of conductive lines includes an additional conductor coincident to the line of symmetry.

13. The oscillator as recited in claim 1, wherein the planar conductive loop and the planar conductive structure form at least a portion of a tank circuit of the oscillator and a common-mode resonant frequency $f_{ocm}$ of the tank circuit is twice a differential-mode resonant frequency $f_{odm}$ of the tank circuit.

14. The oscillator as recited in claim 1, wherein the planar conductive loop has a line width at least an order of magnitude thicker than a second line width of the planar conductive structure.

15. The oscillator as recited in claim 1, wherein the planar conductive structure is formed from a second conductive layer between the first conductive layer and the integrated circuit substrate and is directly coupled to the center tap using interlayer interconnect.

16. The oscillator as recited in claim 1, further comprising:
    at least one tank capacitor coupled to at least one of the first and second terminal; and
    an amplifier circuit coupled between the first and second terminal.

17. The oscillator as recited in claim 1, further comprising:
    a bypass capacitor coupled between the center tap and the planar conductive structure, the bypass capacitor having a capacitance that causes the bypass capacitor to be a short circuit for frequencies of twice a differential mode frequency of the oscillator.

18. The oscillator as recited in claim 4, further comprising:
    a bypass capacitor coupled between the center tap and the planar conductive structure, the bypass capacitor having a capacitance that causes the bypass capacitor to be a short circuit for frequencies of twice a differential mode frequency of the oscillator.

19. The oscillator as recited in claim 10, further comprising:
    a bypass capacitor coupled to the center tap using interlayer interconnect, the center tap being capacitively coupled to the AC ground node further using the bypass capacitor.

* * * * *